United States Patent [19]

Bluege

[11] 4,386,986
[45] Jun. 7, 1983

[54] HIGH POWER LASER MIRROR REPAIR

[75] Inventor: John H. Bluege, Lake Park, Fla.

[73] Assignee: United Technologies Corporation, Hartford, Conn.

[21] Appl. No.: 251,680

[22] Filed: Apr. 6, 1981

[51] Int. Cl.³ ............................................... B32B 35/00
[52] U.S. Cl. ..................................... 156/94; 29/402.01;
29/402.18; 156/150; 156/305; 228/198;
248/544; 264/1.9; 264/2.6; 264/36; 350/310;
350/320; 427/237; 427/252; 427/255
[58] Field of Search ................. 65/28; 156/94, 305,
156/150; 228/198; 248/544; 264/1.9, 2.6, 36;
350/310, 320; 427/237, 252, 255; 29/402.01,
402.18; 428/188

[56] References Cited

U.S. PATENT DOCUMENTS

| 3,841,737 | 10/1974 | Rambauske et al. | 350/310 X |
| 4,042,163 | 8/1977 | Schladitz | 427/237 X |
| 4,314,742 | 2/1982 | Dye et al. | 350/310 |

FOREIGN PATENT DOCUMENTS 518315 7/1976 U.S.S.R. .............................. 228/198

Primary Examiner—Robert A. Dawson
Attorney, Agent, or Firm—Eric W. Petraske

[57] ABSTRACT

A method of bonding a laser mirror faceplate to a substrate involves the use of chemical vapor deposition within coolant passages 12 to form a mechanically strong bond 28 between the faceplate 10 and the substrate 16. The method may also be used for the repair of disbonded sections of laser mirrors without disassembling the faceplate from the substrate.

5 Claims, 4 Drawing Figures

HIGH POWER LASER MIRROR REPAIR

TECHNICAL FIELD

The field of the invention is the fabrication of high power laser mirrors containing a faceplate bonded to a substrate and cooled by coolant passages.

BACKGROUND ART

An article by J. G. Gowan and K. R. Shillito entitled "Stress Corrosion Cracking in Molybdenum Laser Mirrors", to be published in the Proceedings of the Twelfth Boulder Damage Symposium on Optical Materials for High Power Lasers, discloses the use of a chemical vapor deposition sealant technique for applying a protective coating of approximately 1 mil (0.001 inch) thickness to the inside of coolant passages for the purpose of sealing minor cracks caused by stress corrosion and preventing further corrosion. One feature of the technique is the use of dissimilar materials for the body of the mirror and the chemical being applied so that differential thermal contraction results in compressive forces. U.S. Pat. No. 4,042,163, issued to H. J. Schladitz on Aug. 16, 1977, discloses the use of a chemical vapor deposition technique to form a thermally conductive coating on a plurality of thin fibers disposed within a tubular heat exchanger and to connect the fibers to the heat exchanger. The chemical used decomposes at a relatively low temperature and has a high thermal conductivity. The heat exchanger tube is heated to a temperature which causes the chemical substance to decompose and attach itself to the inside of the tube and to the fibers.

DISCLOSURE OF INVENTION

The invention relates to a method of repairing a disbonded area between a high power laser mirror faceplate and its associated substrate, involving the use of a chemical vapor deposition technique or other plating technique to form a coating within the disbonded area and to fill the gaps that form the disbond. The invention also may be used to form the entire bond between a faceplate and a substrate. An advantageous feature of the invention is the use of a chemical for deposition that is thermally compatible with the faceplate and the substrate.

BEST MODE FOR CARRYING OUT THE INVENTION

Figure 1:
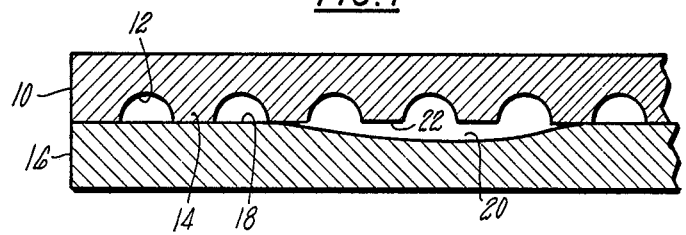
FIG. 1 shows in cross section a laser mirror formed according to the invention.
Figure 2A:
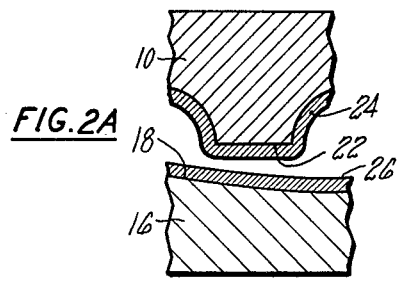
FIGS. 2A and 2B show in partial cross section a disbonded laser mirror in the process of being repaired by means of the inventive method.
Figure 2B:
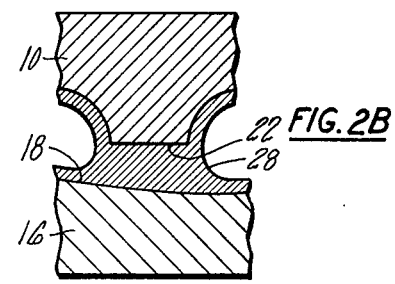

In FIG. 1, faceplate 10, suitable for a high powered laser mirror, contains a plurality of channels 12 for passage of a coolant fluid that are separated by lands 14 and is bonded to substrate 16. In this drawing, a portion of the bond between the faceplate and substrate has broken apart in region 20 and surface 22 of one of the lands of the faceplate is no longer attached to surface 18 of the substrate. In the prior art, the only method of repairing such a disbonded area was to grind off faceplate 10 of substrate 16, fabricate a new faceplate and rebond the whole mirror, an obviously wasteful and time consuming process. By means of the present invention, however, it is possible to repair only that portion of the mirror which is disbonded without separating the faceplate from the substrate. In operation, a chemical vapor is flowed through those of channels 12 which are in the disbonded region 20. The chemical deposits on the interior surfaces of the faceplate and the substrate until it grows to fill in the gap between surface 22 and surface 18. FIG. 2A shows in cross section a typical land in the disbonded region during the repair process. There, a new layer 24 has formed over the interior of the channel in the coolant passage and a new layer 26 has formed on surface 18. FIG. 2B shows a completed joint in which region 28 has expanded until it fills the gap between surface 22 and surface 18, thus forming a strong mechanical bond between faceplate 10 and substrate 18. The operating parameters used to deposit the chemical material are conventional in the chemical vapor deposition art and will depend on the materials being bonded and the degree of heating that may be permitted in the particular application.

Figure 3:
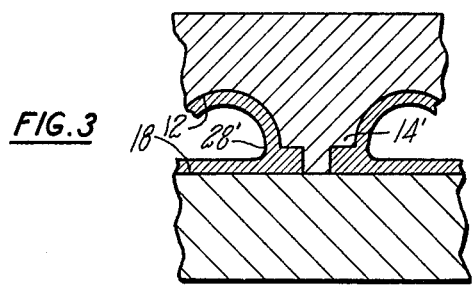
FIG. 3 shows in cross section a segment of a laser faceplate and substrate to be bonded by means of the inventive method.

FIG. 3 shows in cross section a segment of a laser mirror for which the method of the subject invention is to be used to form an initial bond between faceplate 10 and substrate 16. Surface 14' of the land has been altered and shown in the drawing to form an inset to facilitate the formation of a rigid mechanical bond. This particular surface formation involving two cutaway portions of surface 14 is not critical and many other shapes will be obvious to those skilled in the art. In operation, the chemical vapor will coat the interior of coolant channels 12 as before, forming a new surface chemically bonded to both the faceplate and the substrate. The unfinished coolant passages 12 may be formed oversize and the vapor may be deposited at a known rate so that the final surface area of coolant channel 12 and its volume are of predetermined values.

Figure 4:
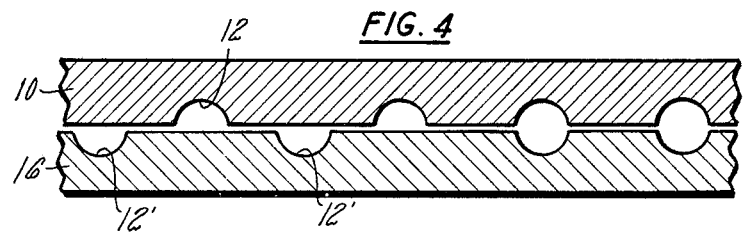
FIG. 4 shows in cross section an alternative embodiment of the invention.

If desired, the portion of the surface of channels 12 that is not close to the bond may be plated or otherwise coated with a material to which the chemical does not adhere, thus reducing the amount of chemical build-up within the channel. In FIG. 4, an alternative embodiment of the invention is illustrated, in which channels 12 and 12' are formed in both the faceplate and substrate. Alternate geometric variations within the scope of the invention will be evident to those skilled in the art.

An advantageous feature of the invention is that the temperatures associated with the chemical vapor deposition process are considerably lower than those associated with the prior art brazing process, so that the risk of thermal distortion of the faceplate is reduced. A second advantageous feature of the invention is that bonds may be formed with difficult to handle materials, such as tungsten, silicon and molybdenum, and the chemical vapor used may be correspondingly tungsten, silicon or molybdenum, thus eliminating the problems of differential thermal expansion between the solid members and the brazing compound.

In the course of practicing the invention, it may be that some coolant passages will become excessively reduced in diameter as a result of the vapor being deposited on them. In such case, some of the deposited chemical may be removed by etching processes well known to those skilled in the art. Since the etching process acts in a direction normal to the surface of the coolant passage, it will remove a uniform amount from the surface, while leaving the newly formed area between the lands and the substrate intact.

Although the invention has been described with respect to a chemical vapor deposition process, the principles of the invention apply to many other processes, such as: low pressure chemical vapor deposition, metal organic chemical vapor deposition, plasma assisted chemical varpor deposition and plating. It should be noted that in none of these processes is the mirror surface contacted with the bonding medium.

I claim:

1. A method of bonding first and second members of a cooled mirror for high power lasers comprising the steps of:

placing a first member, having a first bonding surface including a plurality of coolant channels having channel surfaces, said channels being separated by land members having land surfaces disposed toward said second member, said coolant surfaces and said land surfaces together comprising a portion of said first bonding surface, in close proximity with a second member having a second bonding surface with portions of said second bonding surface disposed with a predetermined relationship to said land surfaces;

passing a bonding medium of predetermined composition only through said plurality of coolant channels; and depositing a bonding chemical from said bonding medium on portions of said first bonding surface and second bonding surface, said bonding chemical being chemically and thermally compatible with said first and second members, in sufficient amount to form a bond joining said first and second members.

2. A method according to claim 1, in which said bonding chemical is deposited from a chemical vapor bonding medium by the process of chemical vapor deposition.

3. A method according to either claim 1 or claim 2, in which the deposition of said chemical is restricted to predetermined portions of said first and second bonding surfaces by means of a further step of applying a barrier coating, before said step of passing said medium, to those portions of said first and second bonding surfaces for which chemical deposition is not desired.

4. A method of repairing a partially disbonded cooled mirror consisting of first and second members, said first member, having a first bonding surface including a plurality of coolant channels having channel surfaces, said channels being separated by land members having land surfaces disposed toward said second member, said coolant surfaces and said land surfaces together comprising a portion of said first bonding surface and a second member, in close proximity with said first member and having a second bonding surface with portions of said second bonding surface disposed with a predetermined relationship to said land surfaces; a portion of said first and second bonding surfaces being separated in a disbond area traversed by a plurality of disbond coolant channels, comprising the steps of:

passing a bonding medium of predetermined composition only through said plurality of disbond coolant channels; and depositing a bonding chemical from said bonding medium on portions of said first bonding surface and second bonding surface, said bonding chemical being chemically and thermally compatible with said first and second members, in sufficient amount to form a bond joining said first and second members.

5. A method according to claim 4, in which said bonding chemical is deposited from a chemical vapor bonding medium by the process of chemical vapor deposition.

* * * * *